(12) United States Patent
Wang et al.

(10) Patent No.: US 8,426,224 B2
(45) Date of Patent: Apr. 23, 2013

(54) NANOWIRE ARRAY-BASED LIGHT EMITTING DIODES AND LASERS

(75) Inventors: Deli Wang, San Diego, CA (US); Xinyu Bao, Mountain View, CA (US); Bin Xiang, El Cerrito, CA (US); Cesare Soci, San Diego, CA (US); David Aplin, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 254 days.

(21) Appl. No.: 12/520,082

(22) PCT Filed: Dec. 18, 2007

(86) PCT No.: PCT/US2007/088001
§ 371 (c)(1),
(2), (4) Date: Dec. 11, 2009

(87) PCT Pub. No.: WO2008/140611
PCT Pub. Date: Nov. 20, 2008

(65) Prior Publication Data
US 2011/0163292 A1      Jul. 7, 2011

Related U.S. Application Data

(60) Provisional application No. 60/870,559, filed on Dec. 18, 2006.

(51) Int. Cl.
*H01L 21/00* (2006.01)
(52) U.S. Cl.
USPC .............................. 438/22; 136/263; 977/762
(58) Field of Classification Search .................... 438/22; 136/263; 977/762
See application file for complete search history.

(56) References Cited

U.S. PATENT DOCUMENTS

| | | | |
|---|---|---|---|
| 7,301,199 B2 | 11/2007 | Lieber et al. | |
| 7,605,327 B2 * | 10/2009 | Roscheisen et al. | 136/263 |
| 7,635,905 B2 * | 12/2009 | Kim, II | 257/432 |
| 7,638,345 B2 * | 12/2009 | Lee et al. | 438/27 |

(Continued)

FOREIGN PATENT DOCUMENTS

KR    10-2005-0006632 A    1/2005

OTHER PUBLICATIONS

International Search Report and Written Opinion for PCT/US2007/088001 issued Mar. 3, 2009.

(Continued)

*Primary Examiner* — David Vu
*Assistant Examiner* — Brandon Fox
(74) *Attorney, Agent, or Firm* — Eleanor M. Musick; Procopio, Cory, Hargreaves & Savitch LLP

(57) ABSTRACT

Semiconductor nanowire arrays are used to replace the conventional planar layered construction for fabrication of LEDs and laser diodes. The nanowire arrays are formed from III-V or II-VI compound semiconductors on a conducting substrate. For fabrication of the device, an electrode layer is deposited on the substrate, a core material of one of a p-type and n-type compound semiconductor material is formed on top of the electrode as a planar base with a plurality of nanowires extending substantially vertically therefrom. A shell material of the other of the p-type and n-type compound semiconductor material is formed over an outer surface of the core material so that a p-n junction is formed across the planar base and over each of the plurality of nanowires. An electrode coating is formed an outer surface of the shell material for providing electrical contact to a current source. Heterostructures and superlattices grown along the lengths of the nanowires allow the confinement of photons in the quantum well to enhance the efficiency and as well as color tuning.

22 Claims, 8 Drawing Sheets

U.S. PATENT DOCUMENTS

| | | | |
|---|---|---|---|
| 7,935,616 B2* | 5/2011 | Burgener et al. | 438/506 |
| 7,943,847 B2* | 5/2011 | Kempa et al. | 136/255 |
| 2004/0175844 A1 | 9/2004 | Yang et al. | |
| 2005/0253138 A1 | 11/2005 | Choi et al. | |
| 2005/0285119 A1 | 12/2005 | Burgener, II et al. | |
| 2006/0279905 A1 | 12/2006 | Chow et al. | |
| 2009/0057650 A1 | 3/2009 | Lieber et al. | |

OTHER PUBLICATIONS

Chen, X-W., et al., "Efficient optical modeling of spontaneous emission in a cylindrically layered nanostructure", Optics Express, Aug. 6, 2007, vol. 15, No. 16, pp. 10356-10361.

Dayeh, S.A., et al., "III-V Nanowire Growth Mechanism: V/III Ratio and Temperature Effects", Nano Letters, 2007, vol. 7, No. 8, pp. 2486-2490.

Look, D.C., "Progress in ZnO Materials and Devices", Journal of Electronic Materials, Jun. 2006, vol. 35, No. 6.

Xiang, B., et al., "Rational Synthesis of p-Type Zinc Oxide Nanowire Arrays Using Simple Chemical Vapor Deposition", Nano Letters, 2007, vol. 7, No. 2, pp. 323-328.

Zhou, J., et al., "Vertically Aligned $Zn_2SiO_4$ Nanotube/ZnO Nanowire Heterojunction Arrays", Small, 2007, vol. 3, No. 4, pp. 622-626.

* cited by examiner

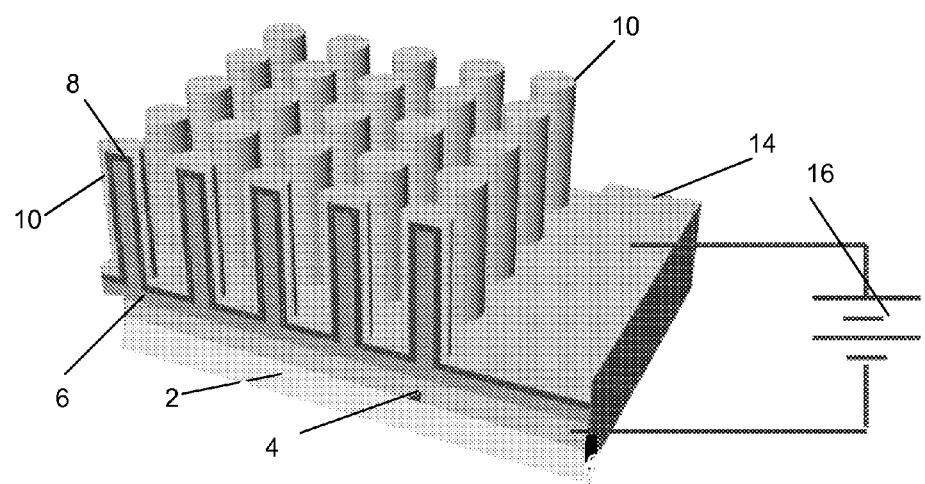
FIG. 1
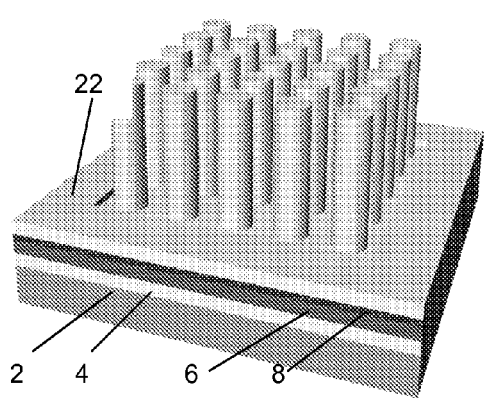 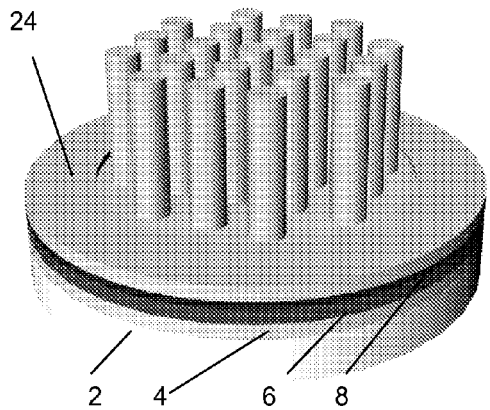
FIG. 2a  FIG. 2b

NANOWIRE ARRAY-BASED LIGHT EMITTING DIODES AND LASERS

RELATED APPLICATIONS

This application claims the priority of U.S. Provisional Application No. 60/870,559 filed Dec. 18, 2006, the disclosure of which is incorporated herein by reference in its entirety.

GOVERNMENT RIGHTS

This invention was made with government support under Grant No. 14-05-1-0149 awarded by the Office of Naval Research (ONR) and Grant No. ECS-0506902 awarded by the National Science Foundation. The government has certain rights in the invention.

BACKGROUND OF THE INVENTION

Increasing environmental awareness relating to global climate change and the desire to reduce dependence on imported fuel sources have helped drive efforts to develop technologies that enable more efficient usage of electrical energy. In the United States, the amount of electricity consumed for lighting is significant, accounting for around 18-20% of the total energy usage in buildings. While the push to adopt compact fluorescent lighting (CFL) has achieved some progress toward the goals of energy efficiency, there are several drawbacks to the CFL bulbs, which include slow starting, inability to dim, limited directionality, and their use of small amounts of mercury, which in some states requires discarded bulbs to be treated as hazardous waste.

The U.S. Congress passed the Energy Policy Act of 2005 directing the U.S. Department of Energy to carry out a "next generation lighting initiative" to promote the development of high-efficiency advanced solid state lighting technologies that could replace conventional lighting sources, including incandescent, halogen, fluorescent and gas-discharge lighting. Solid state lighting technologies include light emitting diodes (LEDs) and lasers. To be accepted as replacements for conventional lighting applications, it is essential that the solid state lighting devices emit light that falls within the standard range of "white light", e.g., warm, neutral and cool-white with typical Correlated Color Temperatures (CCTs) that range from 2670K to 3500K for warm-white, 3500K to 4500K for neutral-white, and 4500K to 10000K for cool-white. While LEDs have long been used as indicator lights, typically colored, in a wide variety of industrial, commercial and consumer electronic devices, it was not until relatively recently that the technology had advanced to the point that white light emitting LEDs were capable of generating sufficiently intense light to be used in traffic lights, outdoor lighting, particularly solar lighting, vehicle tail lights and flashlights, among other applications. These newer generation LEDs have been received with much enthusiasm. For example, beginning in model year 2007, nearly every new car on the market incorporated LED tail lights.

It is estimated that white light emitting diodes (LEDs) are four times more efficient than incandescent and halogen sources and 30% more efficient that linear fluorescent sources. LED lighting has many advantages, including ultra long source life, low power consumption, low maintenance, no UV or IR radiation, cool beam of light, digitally controllable and sustainability.

A variety of white LEDs are currently available commercially, however they cannot yet compete with traditional light sources on the basis of performance or cost. True energy efficiency means using the most efficient light source or system that is capable of providing the amount and quality of light needed. Ongoing research and development efforts are directed to improving the performance of white LEDs to levels suitable for general lighting applications.

Most LEDs are formed by growing epitaxial layers, including p-type and n-type layers, on a growth substrate. A light-emitting active layer is sandwiched between the n- and p-layers. Green, blue, and ultraviolet LEDs are typically gallium-nitride based, where the growth substrate may be either sapphire, SiC, silicon, SiC-on-insulator (SiCOI), or other engineered substrate. Infrared, red, and amber LEDs are typically some combination of AlInGaPAs and grown on a GaAs or InP substrate. White LEDs have primarily been formed from aluminum or indium gallium nitride (Al/InGaN) on substrates of silicon carbide (SiC) or gallium nitride (GaN), however, zinc oxide has been the object of research for use in white LEDs. Most reported work to date on white LEDs has utilized thin film planar technology, although many researchers in the field are directing their attention to nanostructures such as nanowires, nanorods, nanofibers, etc. to exploit the greatly increased carrier injection surface areas that these structures provide.

Zinc oxide (ZnO) is a wide direct bandgap semiconductor ($E_g$=3.4 eV) that displays unique features that make it particularly attractive for use in solid state lighting and other applications. Some of these features include that it has large exciton binding energy $E_b$=60 meV), suggesting that ZnO-based lasers should have efficient optical emission and detection, large piezoelectric, and ferromagnetic coefficients with a predicted Curie temperature above room temperature when doped with transition metals. The cost and ease of manufacture of ZnO is attractive when compared against other common semiconductor materials. It has excellent radiation resistance (2 MeV at $1.2 \times 10^{17}$ electrons/cm$^2$), which is desirable for radiation hardened electronics. Zinc oxide has high thermal conductivity (0.54 W/cm*K). It has strong two-photon absorption with high damage thresholds, which is important for use in optical power limiting devices. Additional features of ZnO are detailed in U.S. Patent Publication No. 2005/0285119 A1 of Burgener, II et al., which is incorporated herein by reference.

The availability of a rich genre of nanostructures make ZnO an ideal material for nanoscale optoelectronics, electronics, and biotechnology. Functional devices such as vertical nanowire (NW) FETs, piezoelectric nano-generators, optically pumped nano-lasers, and biosensors have already been demonstrated. However, similar to other wide bandgap semiconductors, such as GaN, unintentionally doped ZnO is intrinsically n-type and obtaining p-type doping has proven extremely challenging. Although p-type conduction in ZnO thin film has been reported (see, e.g., D. F. Look et al., "The Future of ZnO Light Emitters", *Phys. Stat. Sol.,* 2004, incorporated herein by reference, which summarizes data on p-type ZnO samples reported in the literature), it still remains elusive, and no p-type ZnO NWs have been reported as yet. Complementary doping (both n-type and p-type doping) is essential for functional device applications and the lack of p-type ZnO NWs is currently a major factor precluding the realization of a wide range of functional nanodevices based on ZnO.

BRIEF SUMMARY OF THE INVENTION

In one aspect of the invention, semiconductor nanowire arrays are used to replace the conventional planar layered construction for fabrication of LEDs and laser diodes. In an exemplary embodiment, nanowire arrays are formed from III-V or II-VI compound semiconductors on a conducting substrate using known nanowire growth techniques, including deposition, epitaxy solution syntheses, and template-assisted electrochemical syntheses. The nanowires can be formed as an n-core/p-shell or p-core/n-shell to create p-n junctions in each nanowire. Alternatively, axial heterostructure nanowires (superlattices) can be formed along the length of the nanowire during growth or by nanoimprinting or lithography and etching from a layered structure. Nanowires can also be created by combining core/shell (radial) and axial heterostructure formation techniques.

In an exemplary embodiment, a solid state lighting device is formed from a conductive substrate, an electrode layer deposited on the substrate, a core material comprising one of a p-type and n-type compound semiconductor material formed on top of the electrode as a planar base with a plurality of nanowires extending substantially vertically therefrom, a shell material comprising the other of the p-type and n-type compound semiconductor material formed over an outer surface of the core material so that a p-n junction is formed across the planar base and over each of the plurality of nanowires, and an electrode coating formed an outer surface of the shell material for providing electrical contact to a current source.

Rare earth light emitting centers can be introduced during formation of the nanowires to tune the emitted wavelength from UV to IR. A transparent electrode such as indium tin oxide (ITO) is thinly coated onto the shell material.

Nanowires form natural Fabry-Perot cavities so that amplified spontaneous emission (ASE) can be achieved. In one embodiment, superlattices are used to define distributed Bragg reflector (DBR) structures in nanowires to reduce the lasing threshold. Growth of axial heterostructure nanowires (superlattices) along the length of the nanowire and the nanowire arrays allow high efficiency, low threshold injection lasers. The nanowire array lasers can also be fabricated by lithographically etching down from a layer structure, such as a vertical-cavity surface-emitting laser (VCSEL), into nanoscale wire arrays.

In a preferred embodiment, ZnO nanowires and core/shell nanowire arrays are used to manufacture LEDs and laser diodes. Nanowires formed from ZnO doped with phosphors or un-doped, or ZnO alloys, including MgZnO, ZnBeO, ZnCdO, can be used as active building blocks for light emitting diodes, providing for low cost manufacturing of LEDs.

Compared to planar thin film LEDs, nanowires have a large surface area-to-volume ratio, which is proportional to the diameter of the nanowire. The large total surface area provides an enlarged carrier injection p/n junction area in which the electrons and holes recombine and emit photons. Heterostructures and superlattices grown along the lengths of the nanowires, or formed radially across the nanowires, allow the confinement of photons in the quantum well to enhance the efficiency and as well as provide for color tuning.

The nanowire array geometry is typically perfectly vertical, or within a small range of variations from vertical, relative to the substrate. The small nanowire diameters minimize or eliminate the total internal reflection that normally occurs with existing planar thin film LEDs, further enhancing light extraction efficiency.

Single crystal ZnO nanowire growth is not limited by lattice matched substrates, and therefore can grow virtually from any substrate, unlike their thin film counterparts. GaN-based thin film LEDs require expensive substrates such as SiC or sapphire, and there can still be large lattice mismatch between the GaN and the substrate, such that defect-free thin film is hard to achieve. These defects tend to limit LED efficiency. ZnO thin film LEDs show promise because of the availability of inexpensive lattice matched ZnO substrate, and has the further advantage that no toxic precursors are required. ZnO nanowires can be easily synthesized using solution-based methods, which could further bring down the cost of LEDs fabricated using ZnO nanowires.

One of the obstacles to fabrication of LEDs and lasers using ZnO nanowires has been the formation of p-type ZnO. In one aspect of the invention, p-type ZnO is grown using a chemical vapor reactor furnace connected to a source comprising a mixture of zinc oxide powder, graphite powder and phosphorous pentaoxide power. A substrate is placed within the furnace, downstream from the source. A mixture of nitrogen and oxygen is injected into the furnace while the substrate is subjected to an elevated temperature for a predetermined period of time until nanowires of a pre-determined size are formed.

BRIEF DESCRIPTION OF THE DRAWINGS

FIG. 1 is a diagrammatic perspective view, partially cut away, of a nanowire array LED according to the present invention.

FIGS. 2a and 2b are diagrammatic perspective views of alternate embodiments of nanowire array LEDs with uniform carrier injection.

FIG. 4a is a low magnification SEM image of the well oriented ZnO:P nanowire arrays. The scale bar is 2 pm. FIG. 4b is a high-magnification SEM image of the ZnO:P nanowire arrays, showing that the nanowires have uniform diameters (~55 nm) and very smooth surfaces. The scale bar is 200 nm.

FIG. 5a shows temperature dependence of the photoluminescence spectra of thermally annealed ZnO:P nanowires, in the temperature range of 10 K-300 K. FIG. 5b shows temperature-dependent photoluminescence spectra (10K-300K) of as-grown ZnO:P nanowires. FIG. 5c shows temperature-dependent photoluminescence spectra of n-type ZnO nanowires from 10K to 300K.

FIG. 8a shows $I_{DS}$-$V_{DS}$ plots of the ZnO:P nanowire treated by RTA transistor at different back-gate voltages. FIG. 8b shows $I_{DS}$-$V_{GS}$ plot of the annealed ZnO:P nanowire transistor at $V_{DS}$=15V. The inset is a SEM image of the measured device. The scale bar is 500 nm. FIG. 8c shows $I_{DS}$-$K_{DS}$ plots of the as-grown ZnO:P nanowire transistor at the different back-gate voltages. The inset shows the corresponding $I_{DS}$-$V_{GS}$ plot at $V_{DS}$=6V. FIG. 8d shows $I_{DS}$-$V_{DS}$ plots of the n-type ZnO nanowire transistor at different backgate voltages. The corresponding $I_{DS}$–$V_{DS}$ plot at $V_{DS}$=15V is displayed in the inset.

DETAILED DESCRIPTION OF THE INVENTION

Figure 3:
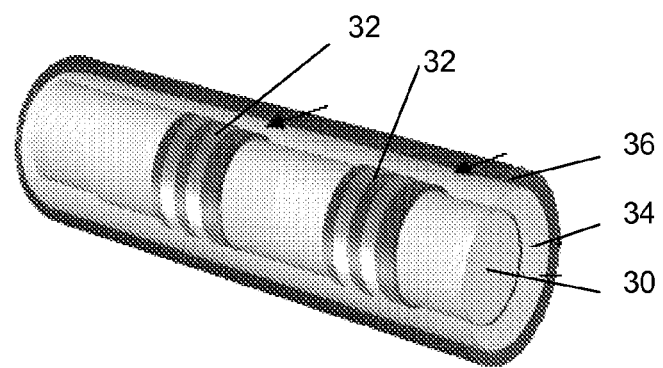
FIG. 3 is a diagrammatic perspective view, partially cut away, of nanowire heterostructures for a nanolaser with a DBR structures from either nanowire growth or planar structure etching down.

According to the present invention, semiconductor nanowire arrays are used to replace the conventional layer design for fabrication of LEDs and laser diodes. In one embodiment, core-shell nanowire arrays are formed on a conducting substrate using known nanowire growth techniques, including Chemical Vapor Deposition (CVD), Metal Organic Chemical Vapor Deposition (MOCVD), Molecular and Chemical Beam Epitaxy (CBE and MBE), solution syntheses, and template-assisted electrochemical syntheses. The conducting substrates can be ITO (indium tin oxide), FTO (fluorine-doped tin oxide), tin oxide, zinc oxide, degenerated doped Si, metals, or other similar materials. Where the growth technique is solution-based, the nanowires can also be formed on a metal coated substrates that can later serve as an electrode.

The nanowires can be formed from III-V or II-VI compound semiconductors, such as AlInGa, ZnO, and alloys thereof, such as $Al_xIn_yGa_{(1-x-y)}P_zAs_{(1-z)}$, $Al_xIn_yGa_{(1-x-y)}P_zAs_{(1-z)}$:N (dilute nitride), $Al_xIn_yGa_{(1-x-y)}N$, ZnMgCdO, and ZnBeCdO. The nanowires are formed as a n-core/p-shell or p-core/n-shell to create p-n junctions in each nanowire. In a preferred embodiment, ZnO nanowires and core/shell nanowire arrays are uses to manufacture LEDs and laser diodes. Nanowires formed from ZnO doped with phosphors or un-doped, or ZnO alloys, including MgZnO, ZnBeO, ZnCdO, can be used as active building blocks for light emitting diodes, providing for low cost manufacturing of LEDs. For ZnO nanowires, alloying with magnesium (Mg), beryllium (Be) or cadmium (Cd) allows color tuning from UV to visible. For nanowires synthesized from solution, rare earth light emitting centers such as Er3+, Pr3+, Eu3+, etc. can be introduced for color tuning for manufacture of UV to IR LEDs. During solution synthesis, salts of the desired rare earth elements, e.g., $EuCl_3$, can be added to the reaction solutions to be incorporated in the crystals.

FIG. 1 illustrates the general structure of an LED fabricated from a nanowire array. A conducting substrate 2 is patterned using either nanoimprinting (NIL) or lithography (electron beam lithography or photolithography). Bottom electrode 4 is formed on top of substrate 2. In the preferred embodiment, electrode 4 is ITO, which is formed as a thin film on the substrate 2 using conventional methods such as thermal evaporation, spray pyrolisis, screen printing or sputtering. Core layer 6 is formed on top of electrode 4 by any of the known methods for nanowire formation. In the exemplary embodiment, the core layer 6 is n-type ZnO which is formed by a CVD process. The ZnO can be phosphorous doped or undoped, since ZnO is intrinsically n-doped. Shell layer 8 is deposited by a CVD/MOCVD or a solution process to form a p-type ZnO layer over the n-type nanowires. Alternatively, the core layer 6 is a p-type material and the shell layer 8 is n-type. While growth of n-ZnO is known in the art, creation of p-ZnO has been problematic. The details of a novel process for forming p-ZnO are provided below.

After formation of the shell layer 8, a thin layer transparent electrode 10, such as ITO, is coated over the shell layer, including over a planar electrode section 12 that does not have nanowires formed thereon. An upper electrode 14 is deposited over the transparent electrode 10 on the planar electrode section 12 by conventional deposition or thin film techniques. A current source 16 can then be connected using wire bonding or other appropriate methods that are known in the art.

In another embodiment, additional deposition/growth steps can be incorporated into the core/shell formation process to define at least one intrinsic layer, quantum well, or superlattice structure in a radial direction within each of the plurality of nanowires to confine the carrier to enhance the efficiency and/or to tune the emitting light color. To provide one example, alternating thin shells of n- and p-type semiconductors can be formed on the outer surface of the shell/core p-n junction, prior to forming the electrode coating, to define an annular superlattice surrounding the shell/core structure of each nanowire for enhancing efficiency or tuning.

FIGS. 2a and 2b illustrate nanowire array LEDs that have a planar electrode section that surrounds the array to provide uniform current injection. In FIG. 2a, the planar electrode section 22 is a square that frames the array, while FIG. 2b shows an annular planar electrode section 24 encircling the array. All other elements of the array are the same as those shown in FIG. 1.

Nanowires form natural Fabry-Perot cavities, allowing amplified spontaneous emission (ASE) to be achieved. Growth of superlattices along the length of the nanowire allow for the incorporation of distributed Bragg reflector (DBR) structures to reduce the lasing threshold, producing high efficiency, low threshold injection lasers. In the embodiment illustrated in FIG. 3, an n-type InP core 30 is formed with periodic introduction of a series of alternating inputs of GaInAs and InGaAsP to create the DBR structures 32. Timing of the introduction of the DBR material sources will depend on the desired emission characteristics of the laser. After the core is grown to the desired length, a shell 34 of InGaAsP is formed over the core 30 to define the active region. A p-type InP shell 36 is formed over the active region 34. Conductors (not shown) are then formed for application of an input current. As an alternative to the superlattice growth, such lasers can be fabricated by lithographically etching a layered structure, such as a vertical-cavity surface-emitting laser (VCSEL), to define an array of nanowires. In one approach the layered structure for formation of the core could be deposited in a planar structure, patterned and etched to define the nanowire structures, then the active layer, shell and conductive coatings can deposited to form the device as illustrated in FIG. 3.

Compared to planar thin film LEDs, nanowires have a large surface area-to-volume ratio, which is proportional to the diameter of the nanowires. The large total surface area provides an enlarged carrier injection p/n junction area in which the electrons and holes recombine and emit photons. Heterostructures and superlattices can be grown along the lengths of nanowires during formation, providing for the confinement of photons in the quantum well for enhanced efficiency and to enable color tuning.

The nanowire array geometry, which is typically perfectly vertical or within a small range of vertical from the substrate, and the small nanowire diameters minimize or eliminate the total internal reflection that normally occurs with existing planar thin film LEDs, further enhancing light extraction efficiency.

Single crystal ZnO nanowire growth is not limited by lattice matched substrates, and therefore can grow virtually from any substrate, unlike their thin film counterparts. GaN-based thin film LEDs require expensive substrates such as SiC or sapphire, and there can still be large lattice mismatch between the GaN and the substrate, such that defect-free thin film is hard to achieve. These defects limit the LED efficiency. ZnO thin film LEDs show promise because of the availability of inexpensive lattice matched ZnO substrate, and has the further advantage that no toxic precursors are required. ZnO nanowires can be easily synthesized using different solution based methods, which would further bring down the cost of LEDs made of ZnO nanowires.

The following discussion details a novel process for incorporating a p-type dopant into zinc oxide nanowires and nanowire arrays, which makes possible the complimentary doping needed for forming p-n junctions for fabrication of electronic devices.

According to the present invention, the synthesis of high-quality p-type ZnO nanowires (NWs) is achieved using a chemical vapor deposition (CVD) method where phosphorus pentoxide ($P_2O_5$) is used as the dopant source. Single crystal phosphorus doped ZnO (ZnO:P) NWs have growth axis along the <001> direction and form vertical arrays on a-plane sapphire over large areas (4 mm×6 mm). P-type doping was confirmed by photoluminescence measurements at various temperatures and by studying the electrical transport in single NWs field-effect transistors (FETs). The room temperature photoluminescence of annealed ZnO:P NWs reveals a sharp band-edge emission at 3.35 eV, indicative of the high crystal quality of the NWs. Comparisons of the low temperature photoluminescence of unintentionally doped ZnO (n-type), as-grown ZnO:P, and annealed ZnO:P NWs show clear differences related to the presence of intra-gap donor and acceptor states. The electrical transport measurements of ZnO:P NW FETs indicate a transition from n-type to p-type conduction upon annealing at high temperature, in good agreement with the photoluminescence results. The synthesis of p-type ZnO NWs enables novel complementary ZnO NW devices and circuits, UV-LEDs and electrically driven nanolasers, multiplexing biosensors, etc. and opens up enormous opportunities for nanoscale electronics, optoelectronics, and medicines.

Figure 4A:
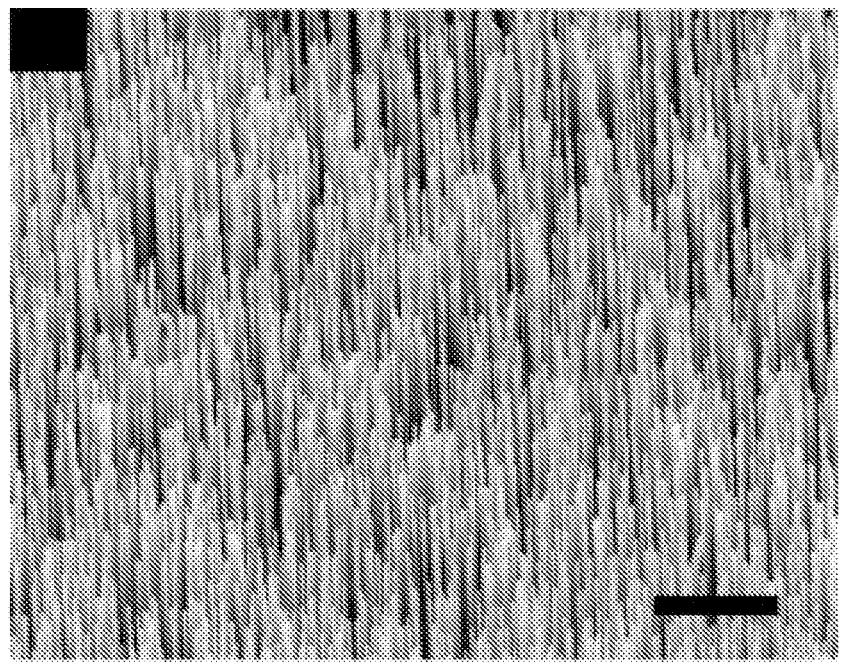
FIGS. 4a and 4b are photomicrographs of structural and morphological characterization of the ZnO:P nanowires, where
Figure 4B:
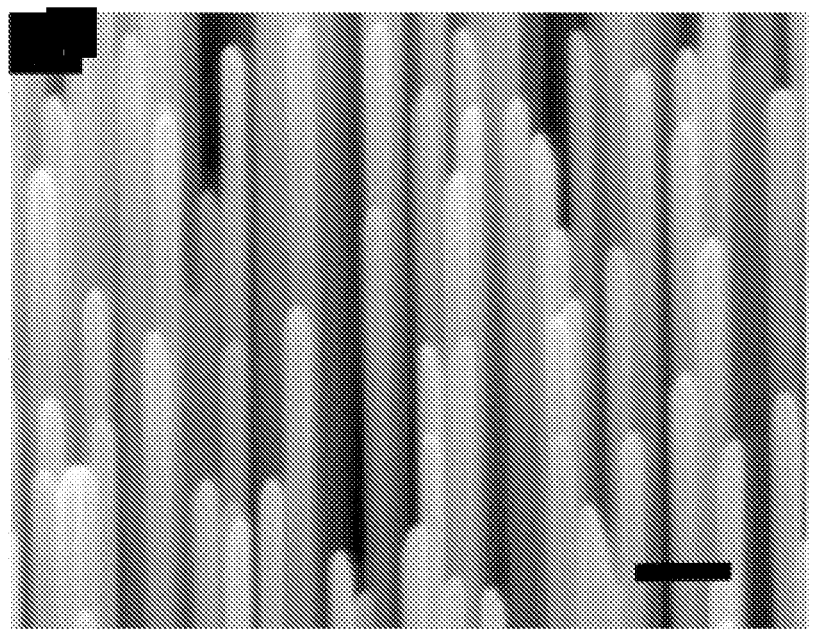

The ZnO:P NWs are grown using a simple tube furnace CVD method through vapor deposition with a mixture of ZnO powder, graphite, and phosphorus pentoxide ($P_2O_5$) as source materials with $O_2/N_2$ mixture as carrier gas. FIG. 4a shows a representative field emission scanning electron microscopy (FE-SEM) image of vertical ZnO NW arrays on a-plane sapphire. Vertical NW arrays covering large areas of the substrate (4 mm×6 mm) have been reproducibly accomplished. For a growth time of 30 minutes, the as-grown ZnO:P NWs shows uniform diameters (between 50 and 60 nm) and length (~2 μm), and morphologically smooth surfaces, which are significantly thinner and longer compared to the unintentionally doped ZnO NWs grown under similar condition (FIG. 4b.) These ZnO:P NWs are slightly tapered at the NW tips. Increasing the $P_2O_5$ weight percentage in the source mixture, results in sharp tapering of the NWs.

Carbon has been used to reduce $P_2O_5$ into P vapor during the elemental phosphorus production according to the following reaction:

$$P_2O_5(s)+5C(s)=2P(g)+5CO(g) \quad (1)$$

Without wishing to be bound by a particular theory, it is believed that carbon simultaneously reduces ZnO and $P_2O_5$ into Zn and P vapors, respectively, which, as clusters ($P_4$ or $Zn_3P_2$), are carried to the sapphire substrate placed downstream. $P_2O_5$ will also be present because of its high vapor pressure. Both $Zn_3P_2$ and $P_2O_5$ are possible dopants that can be incorporated in ZnO NWs during the growth. The Zn—P bond length (2.18 Å) is significantly larger than that of the Zn—O bond (1.93 Å), so that P atoms introduce lattice strain when they occupy the substitutional oxygen sites. P atoms tend to sit in the Zn sites of the lattice and form donor-like antisites, $P_{Zn}$. The $P_{Zn}$—O bonding has a smaller bonding length (1.68 Å) on the c-axis and similar bonding length (1.60

Å) off the c-axis for the ionized $P_{Zn}$ donors. Therefore, $P_{Zn}$ defects will also introduce strain to the ZnO lattice. The strain relaxes along the radial direction of the one-dimensional nanowires and the relaxation increases with decreasing diameter. The smaller diameters of ZnO:P NWs with respect to the unintentionally doped ZnO NWs and their tapered morphology suggest uniform P incorporation into the ZnO NW bodies rather than on the surface layers only.

High resolution transmission electron microscopy (HR-TEM) images show atomically resolved Wurzite ZnO single crystal after annealing. The growth axis is along the <001> direction, which is confirmed by select-area electron diffraction (SAED) analysis. The spacing between c-ZnO:P planes is 5.035 Å, which is significantly smaller than that in intrinsic ZnO NWs (5.2 Å) and in ZnO thin film (5.207 Å), indicating lattice compression due to the P doping and possibly the presence of $P_{Zn}$ defects. The ZnO:P NWs have a perfectly smooth surface without any amorphous coating and highly uniform diameter, which gradually reduces to about 5 nm at the tip with a tapering length of around 50 nm. X-ray diffraction (XRD) analysis shows a strong, sharp peak from the (002) plane and further confirms the high quality of single crystal ZnO:P NWs with growth axis along the c-direction. Energy dispersive X-ray microanalysis (EDX) has detected only zinc and oxygen within the detection limits. X-ray Photoelectron Spectroscopy (XPS) analysis shows that only ZnO phase is obtained, indicating that the ZnO:P NWs do not contain secondary phases or clusters and suggesting atomic level incorporation of the dopant.

The photoluminescence study of ZnO:P NWs after annealing in $N_2$ gas at 850° C. shows a strong emission at 3.352 eV with FWHM of 30 meV at room temperature (FIG. 5a), which is attributed to the band edge emission of ZnO NWs. The broad, weak red emission centered at 1.8 eV indicates the absence of oxygen vacancy levels that are responsible for the typical green emission in ZnO thin film and nanomaterials. The nature of the red emission from P-doped ZnO has not been reported in the literature, which may be due to the radiative recombination of ionized donors and acceptors. The weak red emission is significantly quenched at low temperature and completely disappears at 10 K (FIG. 5a), further suggesting that it originates from the ionized dopants. The peaks between 1.67 and 1.69 eV are believed to be the second-order peaks of the excitonic emission.

The strong UV emission is structured into fine bands (FIG. 6) due to the free exciton (FX, 3.372 eV) and to two neutral acceptor-bound-excitons ($A^0_1X$, 3.357 eV and $A^0_2X$, 3.353 eV), $A^0_2X$ is the strongest peak with a FWHM of ~2 meV.

Figure 5A:
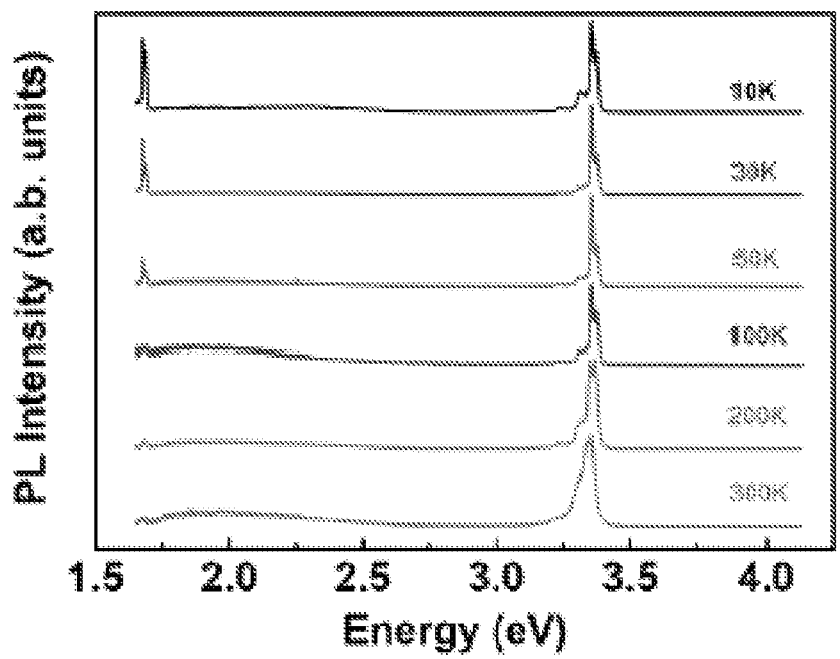
FIGS. 5a-5c are plots of photoluminescence spectra of the as-grown ZnO nanowires.
Figure 5B:
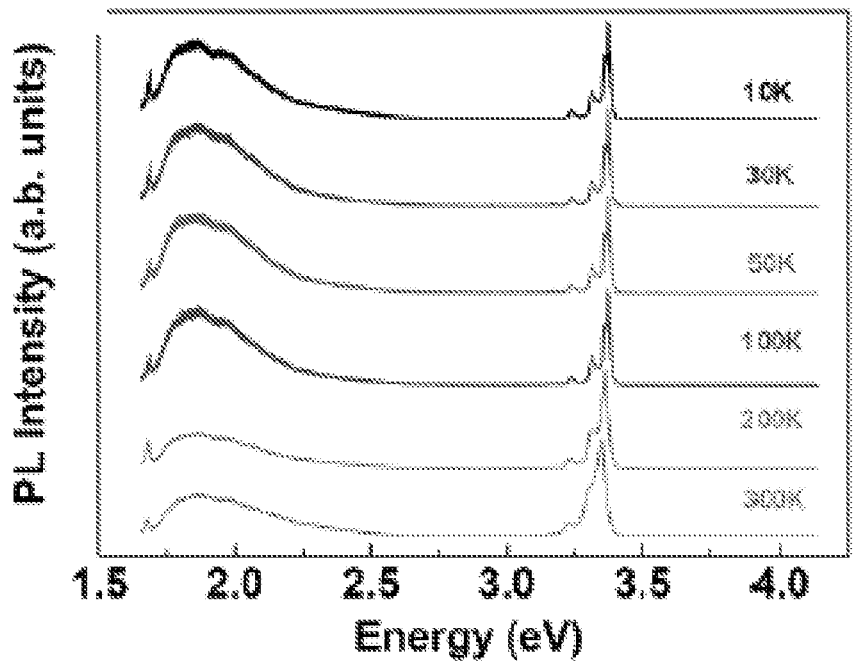
Figure 5C:
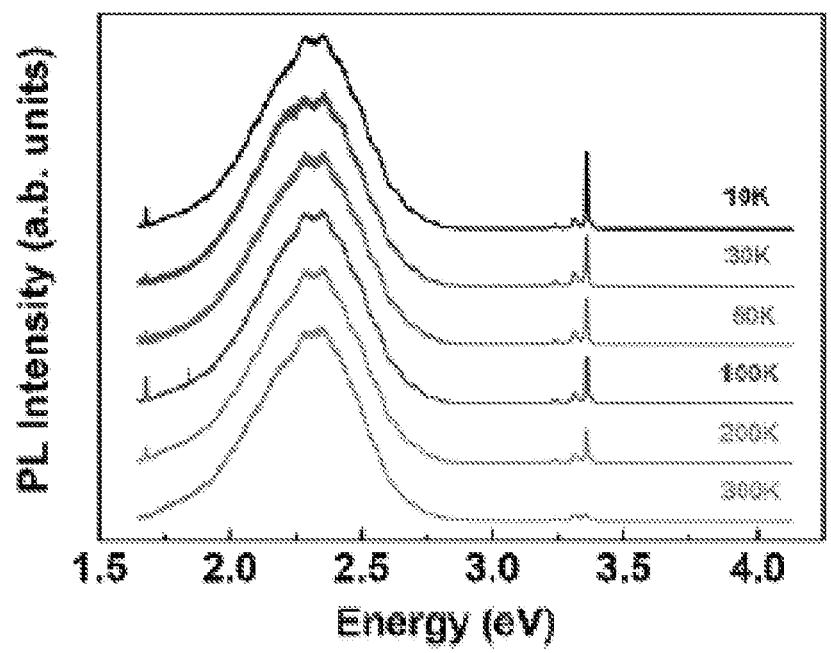

For comparison, temperature dependent photoluminescence measurements were performed on the as-grown ZnO:P NWs (before annealing) (FIG. 5b) and unintentionally doped ZnO grown under similar conditions, but without $P_2O_5$ in the source materials and without $O_2$ input in the carrier gas (FIG. 5c). The room temperature photoluminescence of the as-grown ZnO:P NWs shows a strong photoluminescence emission at 3.35 eV with FWHM of 20 meV and a relatively stronger red emission compared to that after annealing (FIG. 5a). Again, no green emission associated to $V_O$ was observed in as-grown ZnO:P NWs. On the other hand, the room-temperature photoluminescence spectra from ZnO:P NWs are very different from those of the unintentionally n-doped ZnO NWs, as shown in FIG. 5c.

Figure 6:
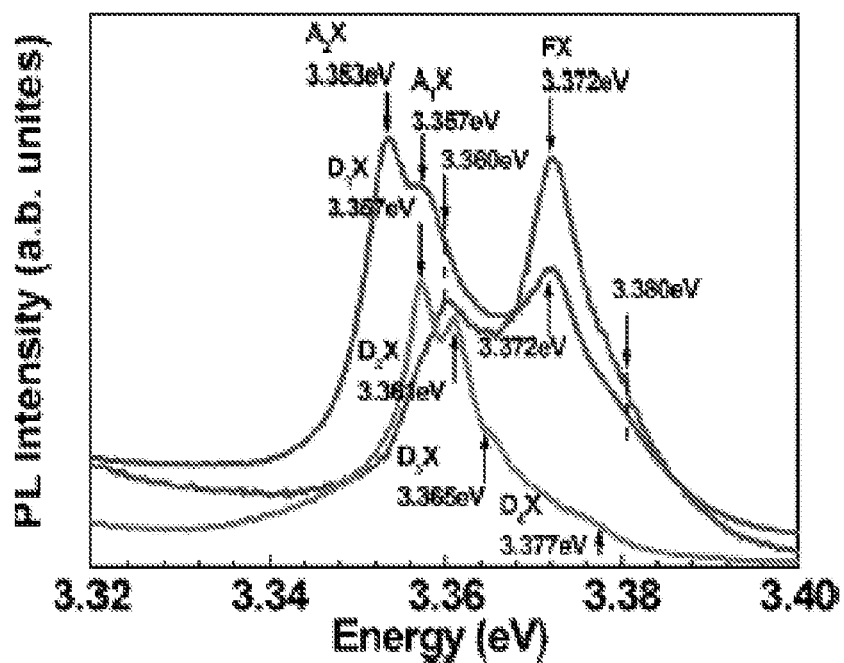
FIG. 6 shows the enlarged photoluminescence spectra (at 10K) of n-type (labeled $D_xX$), as-grown (FX), and annealed ($A_xX$) ZnO:P nanowires.

Low temperature photoluminescence reveals fine excitonic emission from the ZnO NWs. The comparison between the unintentionally doped, as-grown ZnO:P, and annealed ZnO:P NWs unambiguously indicated the p-doping, as shown in FIG. 6. At 10K, this strong UV emission from the annealed ZnO:P NWs is structured into fine bands due to the free exciton peaks, $FX_A$ (3.372 eV) and $FX_B$ (3.380 eV), and two neutral, acceptor-bound excitons, $A^0_1X_A$ (3.357 eV) and $A^0_2X_A$ (3.353 eV), while the $A^0_2X$ is the strongest peak with a FWHM of 2.2 meV (line labeled $A_2X$ in FIG. 6). The line labeled FX in FIG. 6 shows the now-temperature photoluminescence of the as-grown ZnO:P NWs, which shows free exciton levels, $FX_A$ (3.352 eV) and $FX_B$ (3.380 eV), and one neutral donor-bound exciton level, $D_0X$ (3.360 eV). $FX_A$ is the strongest peak that has a FWHM of 4.8 meV. The ZnO:P NWs are significantly different from the n-doped ZnO NWs, which is shown by the line labeled DA in FIG. 3, has only neutral donor-bound exciton peaks, $D^0_1 X_A$ (3.357 eV), $D^0_2 X_A$ (3.361 eV), $D^0_3 X_A$ (3.365 eV), and $D^0_4 X_A$ (3.377 eV). The $D^0_1 X$ is strongest and has a FWHM of 1.8 eV.

Figure 7:
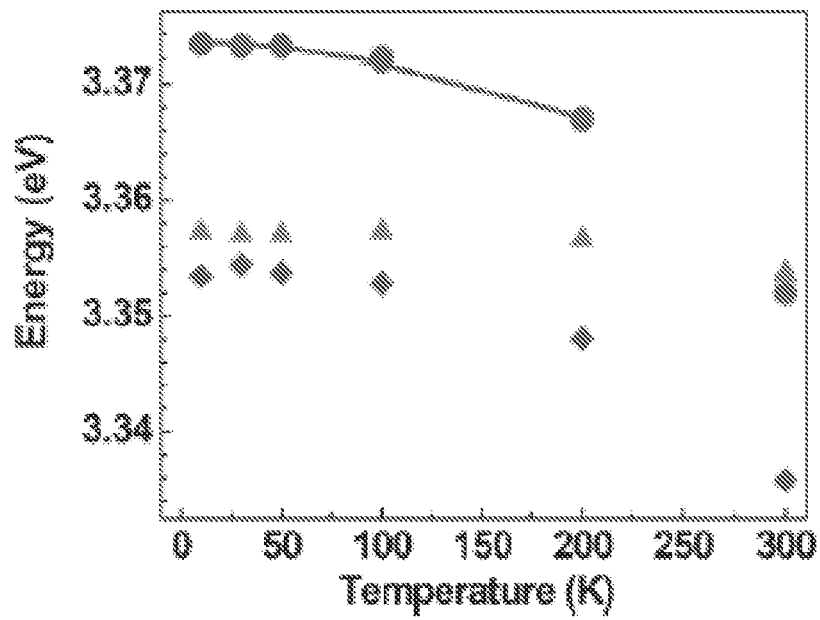
FIG. 7 is a plot of temperature dependence of the transition energy of the AX (diamonds), DX (triangles), and FX (dots) photoluminescence peaks. The FX points are obtained from the photoluminescence data of annealed ZnO:P nanowires. The blue line is the corresponding fitting curve derived from the Varshni equation; the AX and DX points are extracted from the photoluminescence data of the n-type ZnO NWs, and of the as-grown ZnO:P NWs, respectively.

FIG. 7 shows the temperature evolution of the intrinsic and extrinsic exciton peaks from 300 down to 10 K. The temperature dependence of free exitons (FX (dots at the top of the plot)) in annealed ZnO:P NWs, donor-bound-excitons (DX (triangles at the center of the plot)) in unintentionally doped ZnO NWs, and acceptor bound-excitons (AX (diamonds at the lower part of the plot)) in as-grown ZnO:P NWs. The free exciton level was found to follow the Varshni formula $E_g(T)= E_g(0)-\alpha T^2/(T+\beta)$, where Eg(T) is the band gap energy, T is temperature (K), and a and 0 are the temperature coefficients that were found to be $1\times10^{-4}$ eV/K and 700 K, respectively.

Figure 8A:
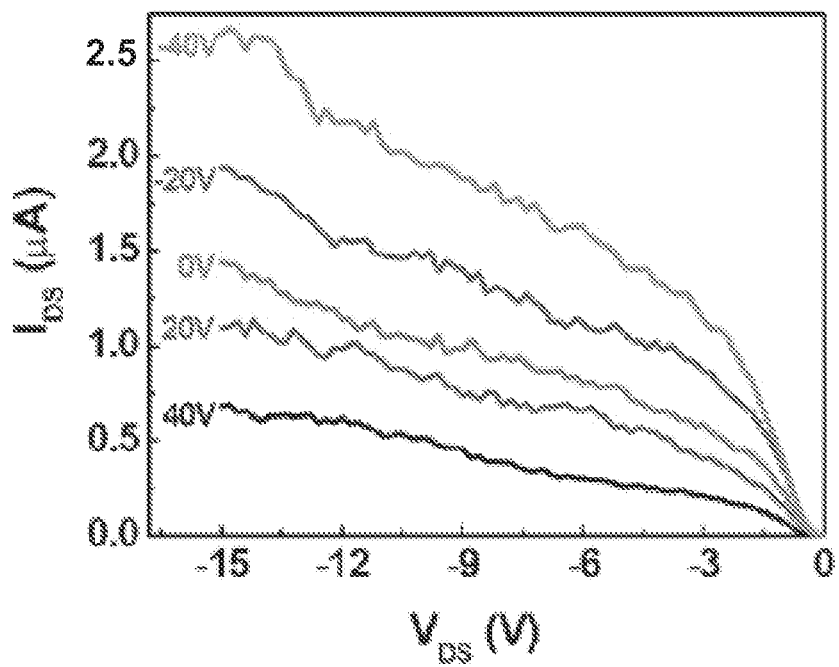
FIGS. 8a-8d are plots of electrical characteristics of ZnO nanowire FETs.
Figure 8B:
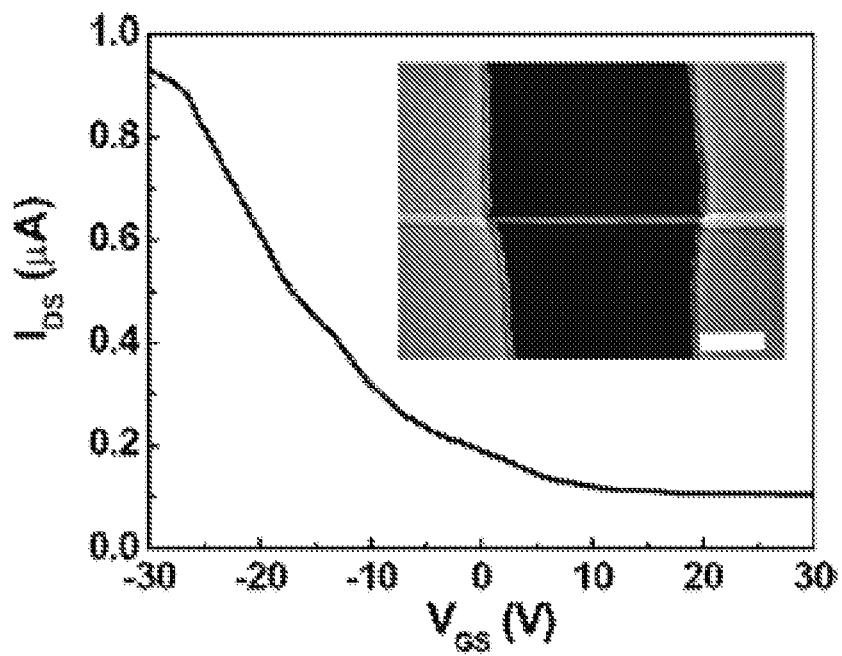

The clear transition from donor-bound exciton peak to acceptor-bound exciton peaks from ZnO:P NWs after the annealing process (FIG. 6) agrees well with the electrical measurement of ZnO NW back-gate field effect transistors (FETs) at room temperature. FIG. 8a shows the output characteristics at various back-gate voltages ($V_{GS}$) and FIG. 8b shows the gate sweep characteristic at $V_{DS}$=15 V of a typical ZnO:P NW with global p$^+$-Si back-gate (FIG. 8b inset), which clearly indicates p-type conduction. The threshold voltage is about $V_{th}$=−5 V, as obtained from a linear extrapolation of the $I_{DS}$-$V_{GS}$ curve in FIG. 8b. The field-effect mobility of the p-type ZnO nanowires can be calculated from $\mu_{FE}=g_m/(2\pi\in\in_0 LV_{DS}/\ln(2t/r))$, where $g_m$ is the transconductance, $\in$ is the relative dielectric constant of the $SiO_2$ dielectric, L is the device channel length and r is the NW radius. $g_m=dI_{DS}/dV_{GS}$ was obtained from the $I_{DS}$-$V_{GS}$ plot to be 0.1 µS (neglecting the contact resistance), corresponding to an estimated carrier mobility of $\mu_{FE}$~1.7 cm$^2$/V·s, which is comparable to the reported results for p-type ZnO films with phosphorus dopants. For a quasi-one-dimensional system, the hole concentration p can be estimated as $p=(V_{gt}/h)\times(2\pi\in\in_0/\ln(2t/r))$, where t is the thickness of the oxide layer and r is the radius of the nanowire. The carrier concentration p is estimated to be ~2.2×10$^7$ cm$^{-1}$. It has been suggested that under $O_2$ rich growth condition, the formation of $[P_{zn}-2V_{zn}]$ complexes is more favorable than the formation of Zn vacancies, $V_{Zn}$, whose $\in$ (1-/0) transition levels act as shallow acceptors compared to $P_O^-$ acceptors, and are responsible for the excellent conductance and high hole concentration of P-doped ZnO. The existence of $[P_{Zn}-V_{Zn}]$ complexes agrees well with the red emission observed in the photo-luminescence studies.

Figure 8C:
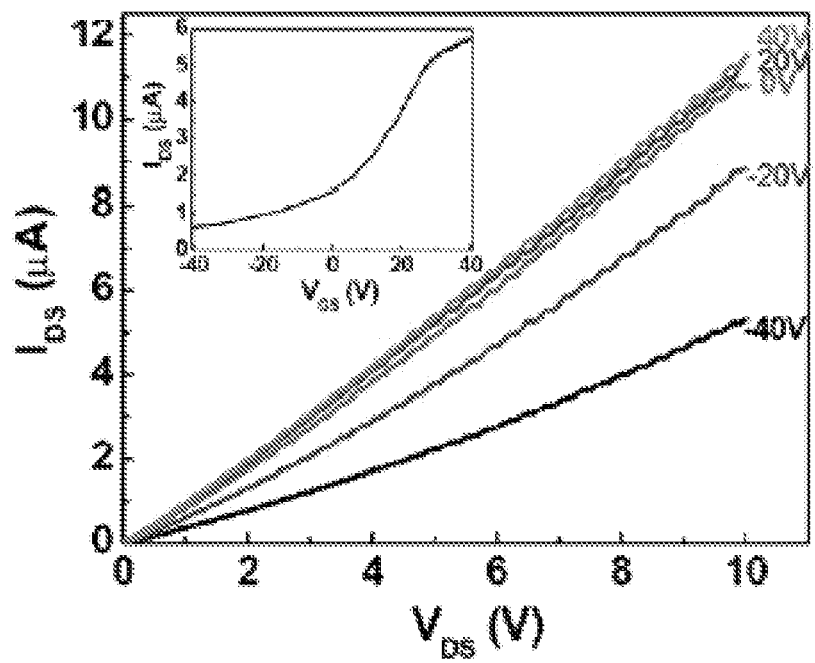
Figure 8D:
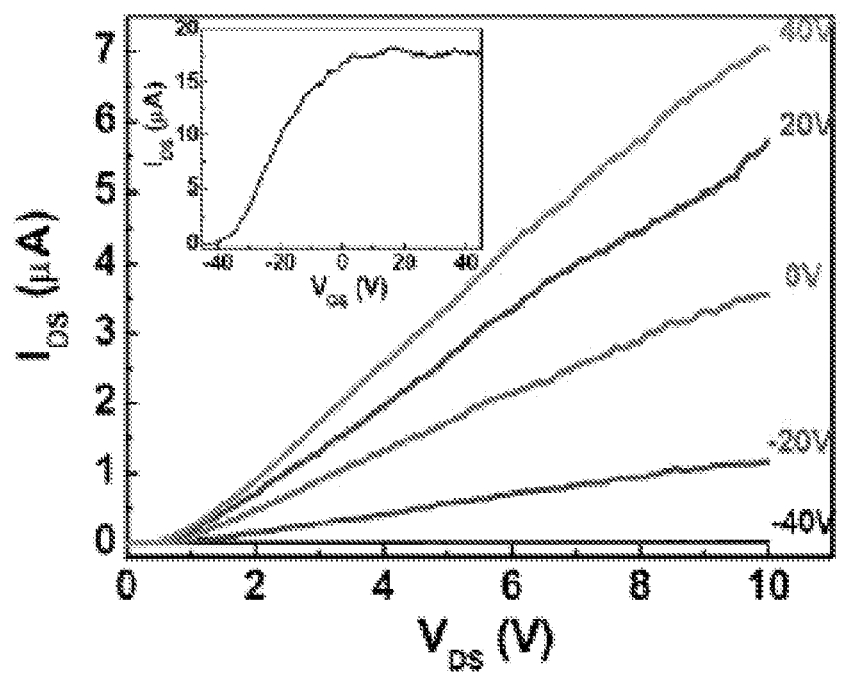

For comparison, representative room temperature output and transconductance characteristics of single as-grown ZnO:P NW FET are shown in FIG. 8c, which clearly demonstrates n-type conductance. The estimated carrier (electron) concentration and mobility are 1.0×10$^8$ cm$^{-1}$ and 2.2 cm$^2$/V·s, respectively. According to the above photoluminescence study, no oxygen vacancies should be present in ZnO:P NWs, therefore, the n-type transport behavior is likely to arise from $P_{Zn}$ antisites, which are donor-like and compensate $P_O$ substitutional dopants. On the other hand, the n-type behavior of unintentionally doped ZnO NWs is clearly related to oxygen vacancies, which is well known in the literature and confirmed by the photoluminescence study (FIG. 5c) described herein. FIG. 8d shows the transistor characteristics of an n-type ZnO NW, from which was estimated a field-effect mobility value of 5.9 cm$^2$/V·s and a carrier concentration of 3.7×10$^8$ cm$^{-1}$. Note that the n-type ZnO NW device has a large on/off ratio of about 10$^7$, while the on/off ratio of ZnO:P NWs devices with/without annealing is much lower (10 and 8, respectively). The p-type conductance from annealed ZnO:P NWs was found to be quite stable and persists for storage in air for more than 2 months before showing n-type behavior.

The foregoing discussion describes the first demonstration of high quality single crystal p-type ZnO NWs using P as the dopant, with growth axis in the <001> crystallographic orientation by a simple CVD method. The nanowire growth is reproducible and perfectly aligned vertical arrays on a-sapphire substrate can be routinely achieved on fairly large areas. The room temperature photoluminescence study of annealed ZnO:P NWs reveals very strong sharp band edge emission at 3.35 eV, which is much stronger than that from unintentionally doped ZnO NWs. At low temperature, clear emission from donor-bound-exciton in unintentionally doped ZnO NWs, from free- and donor-bound excitons in as-grown ZnO:P NWs, and from free- and acceptor-bound-excitons in annealed ZnO:P NWs were observed. No green photoluminescence from both as-grown and annealed ZnO:P NWs could be detected, indicating the absence of oxygen vacancies. A broad red emission was observed in ZnO:P NWs, although it was significantly quenched after thermal annealing. This red emission is effectively quenched at low temperature in the annealed ZnO:P NWs. The red emission has been attributed to radiative recombination between donor and acceptor levels. The low temperature photoluminescence studies agree closely with the transport studies; p-type conductance was observed in the annealed ZnO:P NWs, while both, as-grown ZnO:P NWs and unintentionally doped ZnO NWs showed n-type behavior, although originating from different mechanisms.

In addition to opening up opportunities for nanoscale electronics, optoelectronics, and medicines, p-doping of ZnO NWs could also allow achieving 1D Diluted Magnetic Semiconductor (DMS) nanostructures with Curie temperature higher than room temperature in the research area of carrier-mediated ferromagnetism. Indeed, ferromagnetism has been theoretically predicted in 3d transition metal doped p-type, but not n-type, ZnO.

The phosphorus doped ZnO NW vertical arrays were grown on (100) sapphire (a-plane) substrate using a simple tube furnace chemical vapor deposition (CVD) reactor. The mixture of ZnO powder (99.999% from Cerac, Inc., Milwaukee, Wis.), graphite powder (mesh size of 200 from Alfa Aesar, Ward Hill, Mass.) with a molar ratio of 1:1 ZnO/C, and $P_2O_5$ powder was used as the source. The source was loaded into an $Al_2O_3$ boat, which was set at the center of the tube furnace (LINDBERG®/BLUE M®, Thermo Fisher Scientific, Inc., Newington, N.H.). A-plane sapphire was cleaned using standard wafer cleaning procedure and set to a fixed distance (3.5 inch) downstream to the source boat. A mixture of nitrogen and oxygen (3 sccm) with a total flow rate of 200 sccm was used as a carrier gas. The growth was performed at 945° C. for 30 min. The growth procedure for unintentionally doped ZnO NWs was similar to that of ZnO:P NWs, but a mixture of ZnO and graphite powder only (molar ratio 1:1) and nitrogen only (200 sccm) were used as source and carrier gas, respectively. The thermal annealing was attained in a home-made rapid thermal annealing (RTA) system at 850° C. for 1 minute with $N_2$ gas flow of 25 slm.

The unintentionally doped (n-type), as-grown and annealed ZnO:P NWs were transferred to an $n^+$-Si substrate with a 600 nm thermally grown $SiO_2$ layer (Nova Semiconductors, San Jose, Calif.). Ti/Au (20/160 nm) contact for n-type and as-grown ZnO:P NWs and Ni/Au (100120 nm) contact for annealed ZnO:P NWs were defined by photolithography and consequently deposited using E-beam evaporator. The devices were tested at room temperature using an HP4155 parameter analyzer.

Room temperature and low temperature photoluminescence spectra of ZnO NWs were obtained using an inVia™ Raman microscope (Renishaw plc, Gloucestershire, UK) with a He-Cd laser (325 nm) as the light source. The samples were placed in a closed cycle refrigerator from Janis Research Company, Inc. (Wilmington, Mass.) and cooled by liquid helium. The system was pumped to a pressure of $\sim 10^{-6}$ Torr using a turbo-molecular pump. The laser beam was focused by a microscope objective normal to the substrate surface down to a spot size of around 1 μm in diameter. The laser power was 20 mW. The emitted light was dispersed by a 2400 $mm^{-1}$ grating and detected by a ¼" format CCD with 3.2 mm×2.4 mm slit size.

The nanowire array structures described herein, and the novel process for forming p-type ZnO nanowires, provide means for relatively easy, inexpensive and repeatable manufacture of solid state lighting devices that can be used for a wide range of applications for meeting the goals of highly efficient, sustainable light sources.

The foregoing description of the disclosed embodiments is provided to enable one skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

REFERENCES (INCORPORATED HEREIN BY REFERENCE.)

1. Özgür, Ü. et al. A comprehensive review of ZnO materials and devices. *J. Appl. Phys.* 98, 041301-041404 (2005).
2. Dietl, T., Ohno, H., Matsukura, F., Cibert, J. & Ferrand, D. Zener model description of ferromagnetism in zinc-blende magnetic semiconductors. *Science* 287, 1019-1022 (2000).
3. Janisch, R., Gopal, P. & Spaldin, N. A. Transition metal-doped $TiO_2$ and ZnO-present status of the field. *J. Phys.: Condens. Matter* 17, R657-R689 (2005).
4. Wang, Z. L. Self-assembled nanoarchitectures of polar nanobelts nanowires. *J. Mater. Chem.* 15, 1021-1024 (2005).
5. Fan, H. J., Werner, P. & Zacharias, M. Semiconductor nanowires: from self-organization to patterned growth. *Small* 2, 700-717 (2006).
6. Pan, Z. W., Dai, Z. R. & Wang, Z. L. Nanobelts of semiconducting oxides. *Science* 291, 1947-1949 (2001).
7. Bao, J., Zimmler, M. A. & Capasso, F. Broadband ZnO single-nanowire light-emitting Diode. *Nano Lett.* 6, 1719-1722 (2006).
8. Kind, H., Yan, H., Messer, B., Law, M. & Yang, P. Nanowire ultraviolet photodetectors and optical switches. *Adv. Mater.* 14, 158-160 (2002).
9. Huang, M. H. et al. Room-temperature ultraviolet nanowire nanolasers. *Science* 292, 1897-1899 (2001).
10. Goldberger, J., Sirbuly, D. J., Law, M. & Yang, P. ZnO nanowire transistors. *J. Phys. Chem. B* 109, 9-14 (2004).
11. Ng, H. T., Han, J., Yamada, T., Nguyen, P. & Chen, Y. P., Meyyappan M. Single crystal nanowire vertical surround-gate field-effect transistor. *Nano Lett.* 4, 1247-1252 (2004).
12. Wang, Z. L. Functional oxide nanobelts materials properties and potential applications in nanosystems and biotechnology. *Annu. Rev. Phys. Chem.* 55, 159-196 (2004).
13. Wang, Z. L. & Song, J. Piezoelectric nanogenerators based on Zinc oxide nanowire arrays. *Science* 312, 242-246 (2006).
14. Song, J., Zhou, J. & Wang, Z. L. Piezoelectric and semiconducting coupled power generating process of a single ZnO beluwire. A technology for harvesting electricity from the environment. *Nano Lett.* 6, 1656-1662 (2006).
15. Johnson, J. C. et al., Ultrafast carrier dynamics in single ZnO nanowire and nanoribbon lasers. *Nano Lett.* 4, 197-204 (2004).
16. Morkoc, H. & Mohammad, S. N. High-luminosity blue and blue-green gallium nitride light-emitting-diodes. *Science* 267, 51-55 (1995).
17. Park, C. H., Zhang, S. B. & Wei, S. H. Origin of p-type doping difficulty in ZnO: The impurity perspective. *Phys. Rev. B* 66, 073202-073204 (2002).
18. Xia, Y. et al. One-dimensional nanostructures synthesis, characterization, and applications. *Adv. Mater.* 15, 353-389 (2003).
19. Look, D. C., Claflin, B., Alivov, Y. 1. & Park, S. J. *Phys. Stat. Sol. (a)* 201, 2203-2212 (2004)
20. Duan, X., Huang, Y., Agarwal, R. & Lieber, C. M. Single-nanowire electrically driven lasers. *Nature* 421, 241-245 (2003).
21. Zheng, G., Patolsky, F., Cui, Y., Wang, W. U. & Lieber, C. M. Multiplexed electrical detection of cancer markers with nanowire sensor arrays. *Nat. Biotechnol.* 23, 1294-1301 (2005).
22. Lee, W. J., Kang, J. & Chang, K. J. Defect properties and p-type doping efficiency in phosphorus-doped ZnO. *Phys. Rev. B* 73, 024117-024122 (2006).
23. Massey, A. G. *Main Group Chemistry* Second edition, 286 (John Wiley & Sons, New York, 2000).
24. Ertekin, E., Greaney, P. A., Sands, T. D. & Chrzan, D. C. Equilibrium analysis of lattice-mismatched nanowire heterostructures. *Mat. Res. Soc. Symp. Proc.* 737, F10.4.1-F10.4.6 (2003).
25. Fan, H. J. et al. Patterned growth of aligned ZnO nanowire arrays on sapphire and GaN layers. *Super: Micro.* 36, 95-105 (2004).
26. Teke, A. et al. Excitonic fine structure and recombination dynamics in single-crystalline ZnO. *Phys. Rev. B* 70, 195207-195216 (2004).
27. Wang, L. & Giles, N. C. Temperature dependence of the free-exciton transition energy in zinc oxide by photoluminescence excitation spectroscopy. *J. Appl. Phys.* 94, 973-978 (2003).
28. Martel, R., Schmidt, T., Shea, H. R., Hertel, T. & Avouris, P. Single- and multi-wall carbon nanotube field-effect transistors. *Appl. Phys. Lett.* 73, 2447-2449 (1998).

29. Cui, Y., Duan, X., Hu, J. & Lieber, C. M. Doping and electrical transport in silicon nanowires. *J. Phys. Chem. B* 104, 5213-5216 (2000).
30. Kim, K., Kim, H., Hwang, D., Lim, J. & Park, S. Realization of p-type ZnO thin films via phosphorus doping and thermal activation of the dopant. *Appl. Phys. Lett.* 83, 63-65 (2003).
31. Xiong, G et al. Control of p- and n-type conductivity in sputter deposition of undoped ZnO. *Appl. Phys. Lett.* 80, 1195-1197 (2002).
32. Choi, H. J. et al. Single-crystalline diluted magnetic semiconductor GaN:Mn nanowires. *Adv. Mater.* 17, 1351-1356 (2005).
33. Wang, Q. & Jena, P. Ferromagnetism in Mn-doped GaN nanowires. *Phys. Rev. Lett.* 95, 167202-167205 (2005).
34. Sato, K. & Katayama-Yoshida, H. Material Design for Transparent Ferromagnets with ZnO-Based Magnetic Semiconductors. *Jpn. J. Appl. Phys.* 39, L555-L558 (2000).

The invention claimed is:

1. A method for fabricating a solid state lighting device, comprising:
    selecting a conductive substrate;
    depositing an electrode layer on a surface of the substrate;
    forming a core material comprising one of a p-type and n-type compound semiconductor material on top of the electrode as a planar base with a plurality of nanowires extending substantially vertically therefrom;
    forming a shell material comprising the other of the p-type and n-type compound semiconductor material over an outer surface of the core material so that a p-n junction is defined across the planar base and over each of the plurality of nanowires; and
    forming an electrode coating over an outer surface of the shell material for providing electrical contact to a current source, wherein one of the electrode coating and electrode layer receives a current from the current source to cause the solid state lighting device to emit light; and
    wherein the p-type compound semiconductor is p-type ZnO formed by chemical vapor deposition using a source mixture comprising zinc oxide powder, graphite powder and a phosphorous source; and
    injecting a carrier gas through the source mixture while the furnace temperature is elevated for a predetermined period of time until nanowires of a pre-determined size are formed.

2. The method of claim 1, further comprising defining at least one superlattice structure along a length of each of the plurality of nanowires by, during formation of the core material, periodically adding a source material to produce alternating differentially doped semiconductor layers.

3. The method of claim 1, further comprising forming additional layers over the shell material, prior to forming the electrode coating, to create at least one intrinsic layer, quantum well, or superlattice structure disposed in a radial direction of each of the plurality of nanowires.

4. The method of claim 1, wherein the phosphorous source is phosphorous pentaoxide.

5. The method of claim 1, wherein the phosphorous source is zinc phosphide.

6. The method of claim 1, further comprising annealing the nanowires in nitrogen gas.

7. The method of claim 1, wherein the carrier gas is an oxygen-nitrogen mixture.

8. A method for fabricating a p-type zinc oxide nanowire array, comprising:
    providing a source mixture of zinc oxide, carbon and a phosphorous dopant;
    disposing a substrate in a furnace downstream from the source mixture;
    injecting a carrier gas into the furnace; and
    elevating the furnace temperature to a deposition temperature for a predetermined period of time until nanowires of a predetermined size are formed on the substrate.

9. The method of claim 8, wherein the carbon is a graphite powder.

10. The method of claim 8, wherein the phosphorous dopant is phosphorous pentaoxide.

11. The method of claim 8, wherein the phosphorous dopant is zinc phosphide.

12. The method of claim 8, further comprising annealing the nanowires in nitrogen gas.

13. The method of claim 8, wherein the carrier gas is an oxygen-nitrogen mixture.

14. The method of claim 8, wherein the substrate comprises sapphire.

15. The method of claim 8, wherein the substrate comprises a-plane sapphire.

16. The method of claim 8, further comprising, during the step of injecting, periodically adding an additional source material to produce alternating differentially doped semiconductor layers.

17. A method for fabricating a p-type zinc oxide nanowire array, comprising:
    disposing a source mixture of zinc oxide powder, graphite powder and a phosphorous-containing powder in a source boat in a furnace;
    disposing a substrate in the furnace downstream from the source boat;
    injecting a carrier gas into the furnace; and
    elevating the furnace temperature to a deposition temperature for a predetermined period of time until nanowires of a predetermined size are formed on the substrate.

18. The method of claim 17, wherein the phosphorous-containing powder is phosphorous pentaoxide.

19. The method of claim 17, wherein the phosphorous-containing powder is zinc phosphide.

20. The method of claim 17, further comprising annealing the nanowires in nitrogen gas.

21. The method of claim 17, wherein the carrier gas is an oxygen-nitrogen mixture.

22. The method of claim 17, wherein the substrate comprises sapphire.

* * * * *